(12) United States Patent
Tanaka

(10) Patent No.: US 12,211,560 B2
(45) Date of Patent: Jan. 28, 2025

(54) FAST TWO-SIDED CORRECTIVE READ OPERATION IN A MEMORY DEVICE

(71) Applicant: Micron Technology, Inc., Boise, ID (US)

(72) Inventor: Tomoharu Tanaka, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 17/969,915

(22) Filed: Oct. 20, 2022

(65) Prior Publication Data

US 2023/0178155 A1    Jun. 8, 2023

Related U.S. Application Data

(60) Provisional application No. 63/286,155, filed on Dec. 6, 2021.

(51) Int. Cl.
*G11C 16/26*    (2006.01)
*G11C 16/08*    (2006.01)
*G11C 16/34*    (2006.01)

(52) U.S. Cl.
CPC ............ *G11C 16/26* (2013.01); *G11C 16/08* (2013.01); *G11C 16/3454* (2013.01)

(58) Field of Classification Search
CPC ...................................................... G11C 16/26
See application file for complete search history.

(56) References Cited

U.S. PATENT DOCUMENTS

| 10,223,011 | B2 * | 3/2019 | Yim ................... G06F 11/1068 |
| 11,200,959 | B1 * | 12/2021 | Fitzpatrick ............ G11C 29/14 |
| 2007/0153577 | A1 * | 7/2007 | Guterman .......... G11C 11/5628 365/185.17 |
| 2012/0236636 | A1 * | 9/2012 | Nawata ............... G11C 11/5628 365/185.18 |
| 2014/0198567 | A1 * | 7/2014 | Mokhlesi ............ G11C 11/5642 365/185.24 |
| 2018/0166461 | A1 | 6/2018 | Shim et al. |
| 2018/0197586 | A1 | 6/2018 | Nguyen et al. |
| 2019/0043873 | A1 | 2/2019 | Hasnat et al. |
| 2019/0295653 | A1 | 9/2019 | Yip |
| 2019/0311772 | A1 * | 10/2019 | Diep ..................... G11C 16/08 |
| 2022/0020433 | A1 * | 1/2022 | Seo .................... G11C 16/3404 |

* cited by examiner

*Primary Examiner* — Douglas King
(74) *Attorney, Agent, or Firm* — Lowenstein Sandler LLP

(57) ABSTRACT

A memory device includes an array of memory cells associated with wordlines and control logic. The control logic performs operations that cause a corrective read operation to be performed at a selected memory cell. The operations include: causing a first voltage to be applied to a first wordline associated with the selected memory cell; causing a second voltage, having a lower magnitude than the first voltage, to be applied to wordlines adjacent to the first wordline and associated with each of two neighbor memory cells of the selected memory cell; in response to determining that current flows through the two neighbor memory cells and the selected memory cell between a bitline and a source line of the array, identifying a first corrective read voltage; and causing the first corrective read voltage to be applied to the first wordline during a read operation for the selected memory cell.

20 Claims, 10 Drawing Sheets

FAST TWO-SIDED CORRECTIVE READ OPERATION IN A MEMORY DEVICE

REFERENCE TO RELATED APPLICATION

This application claims the benefit of U.S. Provisional Patent Application No. 63/286,155, filed Dec. 6, 2021, the entirety of which is incorporated herein by reference.

TECHNICAL FIELD

Embodiments of the disclosure are generally related to memory sub-systems, and more specifically, relate to a fast two-sided corrective read operation in a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1A:
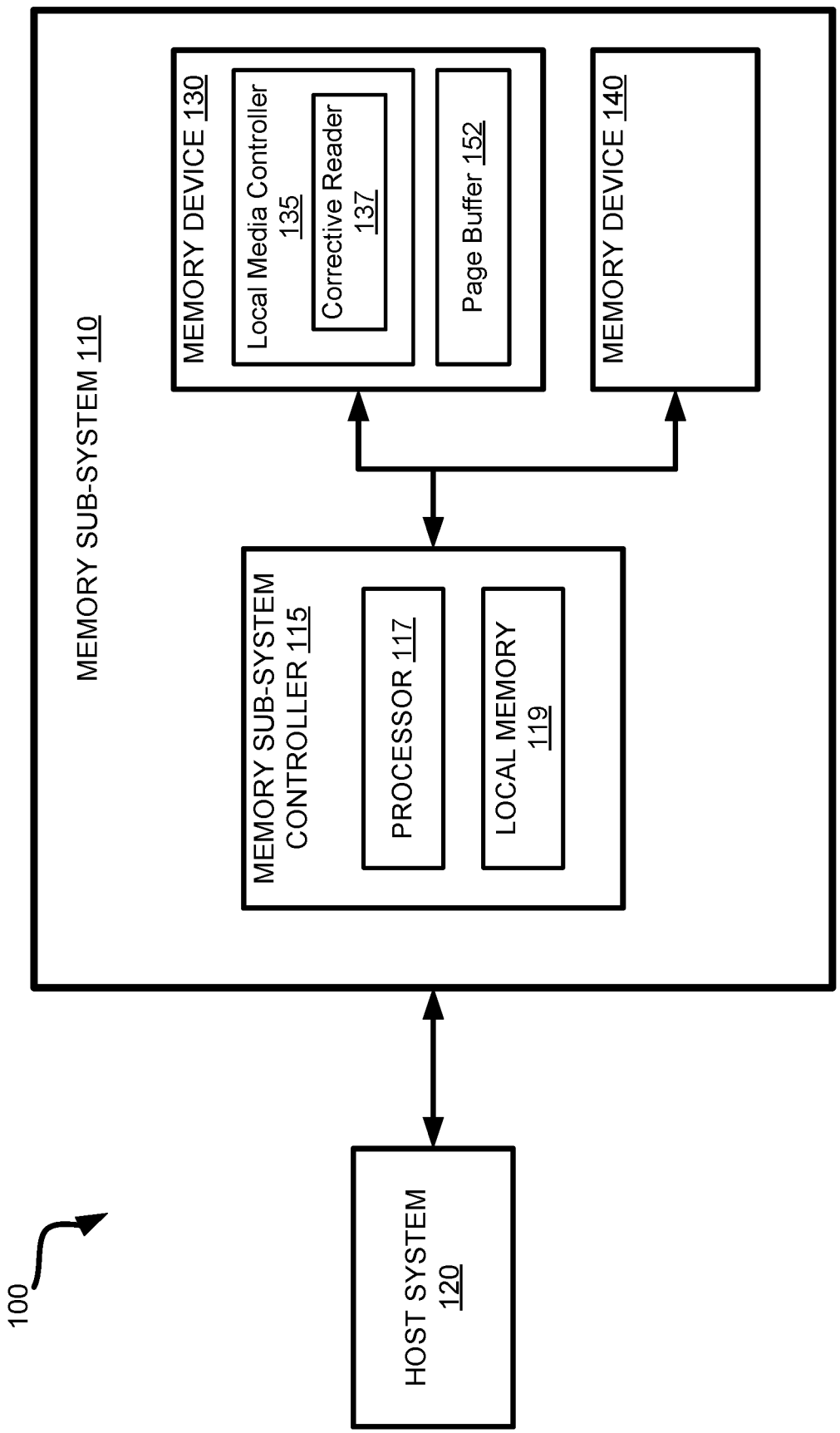
FIG. 1A illustrates an example computing system that includes a memory sub-system in accordance with some embodiments.

Embodiments of the present disclosure are directed to a fast two-sided corrective read operation within memory cells of a memory device. In certain memory devices, a corrective read operation is performed to account for interferences from neighbor (or immediately adjacent) memory cells when performing a read. A neighbor memory cell can include, for example, a memory cell associated with an adjacent wordline. For example, if the neighbor memory cells on either side of a selected memory cell (e.g., in a same memory string but associated with adjacent wordlines) are erased, the maximum amount of electron leakage occurs from the selected memory cell into the neighbor memory cells, causing the threshold voltage (Vt) to drift over time. If only one neighbor memory cell is erased, such electron leakage still occurs, but approximately half as much. Finally, if both neighbor memory cells are programmed, no or relatively little electron leakage occurs into the neighbor memory cells.

Significant electron leakage from neighbor cells causes the threshold voltage of a memory cell to drift more quickly over time. Thus, a corrective read operation can be performed to detect whether neighbor memory cells are erased or programmed. When the selected memory cell is read with a read voltage applied to a gate electrode of the selected memory cell, e.g., via a wordline, the read voltage (e.g., a corrective read voltage) is adjusted depending on the status of these neighbor memory cells. For example, the threshold voltage is adjusted higher if neighbor memory cells are programmed, adjusted lower if neighbor memory cells are erased, and left somewhere between the two adjusted threshold voltages if only one neighbor memory cell is erase while the other is programmed. Such a corrective read operation generally takes a significant amount of time to complete, however, because additional read operations are performed, e.g., an additional read operation for each neighbor cell. For example, a corrective read operation could take approximately three times a normal read time (tR). This hurts performance in the memory device and decreases a quality of service available in the memory sub-system.

Aspects of the present disclosure address the above and other deficiencies by instead conducting just a single additional read operation that determines (or estimates) the state of each neighbor memory cell of a selected memory cell before performing the read operation at the selected memory cell. To do so, for example, a local media controller of the memory device (e.g., control logic) may cause a first voltage to be applied to a wordline of the selected memory cell while a second voltage is applied to a wordline of each of the neighbor memory cells. The second voltage is made to be lower than the first voltage so that current will flow through the three memory cells (the selected memory cell and the two neighbor memory cells) between a bitline and a source line if the neighbor memory cells are erased. In contrast, if at least one of the neighbor memory cells is/are programmed, then the current will not flow.

In these embodiments, in response to determining that current flows through the two neighbor memory cells and the selected memory cell between a bitline and a source line of a memory array, the control logic causes a first (or lowest) corrective read voltage of multiple corrective read voltages to be applied to the wordline of the memory cell. Further by way of these embodiments, in response to determining that current does not flow through the two neighbor memory cells and the selected memory cell, the control logic causes a second (or highest) corrective read voltage of the multiple corrective read voltages to be applied to the wordline of the memory cell. In some embodiments, the multiple corrective read voltages are two in number. In this way, two corrective read voltages can be applied that correspond to two conditions, either both neighbor cells are erased or at least one neighbor cell is programmed, obviating the need for an additional read operation, thereby reducing the time associated with conducting a corrective read operation to approximately two times tR.

Therefore, advantages of the systems and methods implemented in accordance with some embodiments of the present disclosure include, but are not limited to, reducing the number of read operations needed to perform a corrective read operation by a third and significantly reducing read time (tR) for the corrective read operation. A further benefit is the ability to store a status of the neighbor memory cells determined in the first read operation as a one-bit value of information and using this one-bit value to subsequently perform another kind of read operation at the selected memory cell, e.g., a multi-bit read, a valley track read, or a soft-bit read, further saving time in these types of subsequent read operations. Other advantages will be apparent to those skilled in the art of read optimization in memory devices, which will be discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a NOT-AND (NAND) memory device. A non-volatile memory device is a package of one or more dice. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

The memory device 130 can be made up of bits arranged in a two-dimensional or three-dimensional grid, also referred to as a memory array. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a NOT-AND (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOT-OR (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the memory device 130 includes a page buffer 152, which can provide the circuitry used to program data to the memory cells of the memory device 130 and to read the data out of the memory cells. In some embodiments, control logic of the local media controller 135 includes a corrective reader 137 configured to implement or direct the program operations and other related operations discussed herein for performing a fast two-sided corrective read operation. The control logic can be operatively coupled to the array of memory cells within the memory device 130, as discussed with reference to FIG. 1B. For example, the control logic can perform a corrective read operation at three consecutive memory cells, one of which is the selected memory cell to be read (e.g., positioned between to neighbor memory cells) as will be described in more detail. In some embodiments, this control logic is integrated in whole or in part within the memory sub-system controller 115 and/or the host system 120.

Figure 1B:
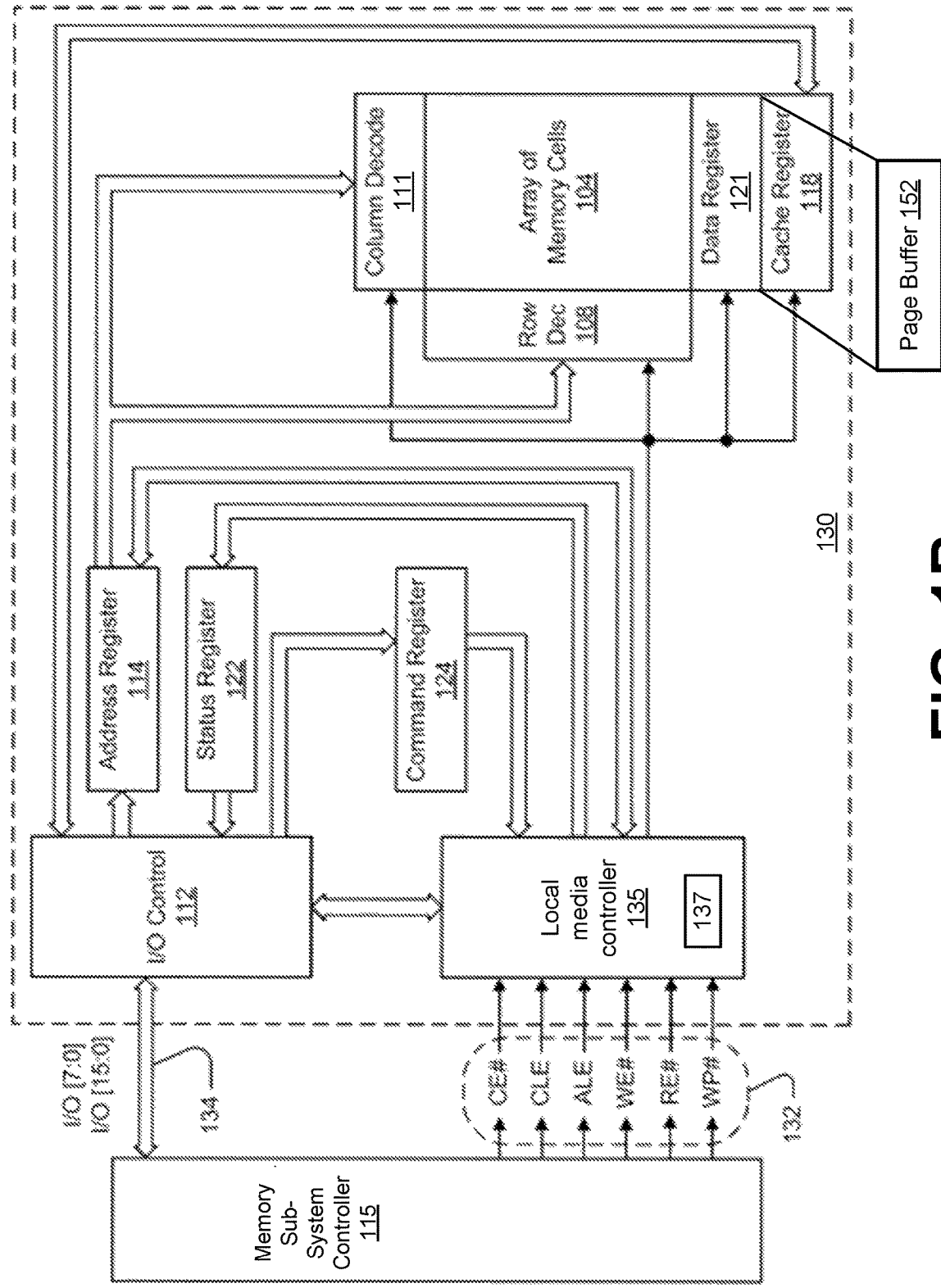
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) the page buffer 152 of the memory device 130. The page buffer 152 can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115. The local media controller 135 can include the corrective reader 137.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
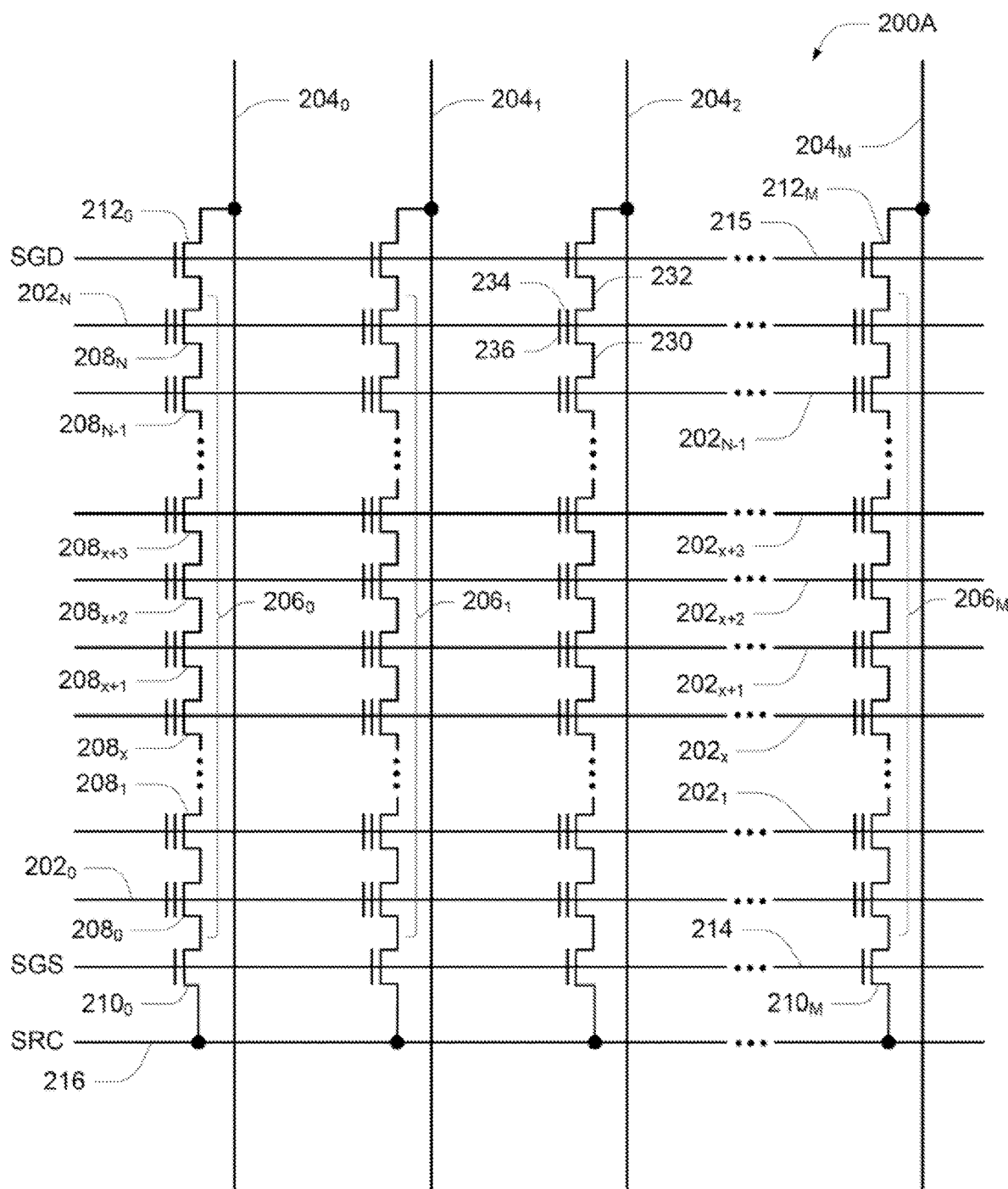
FIG. 2A-2B are schematics of portions of an array of memory cells as could be used in a memory of the type described with reference to FIG. 1B according to an embodiment.
Figure 2B:
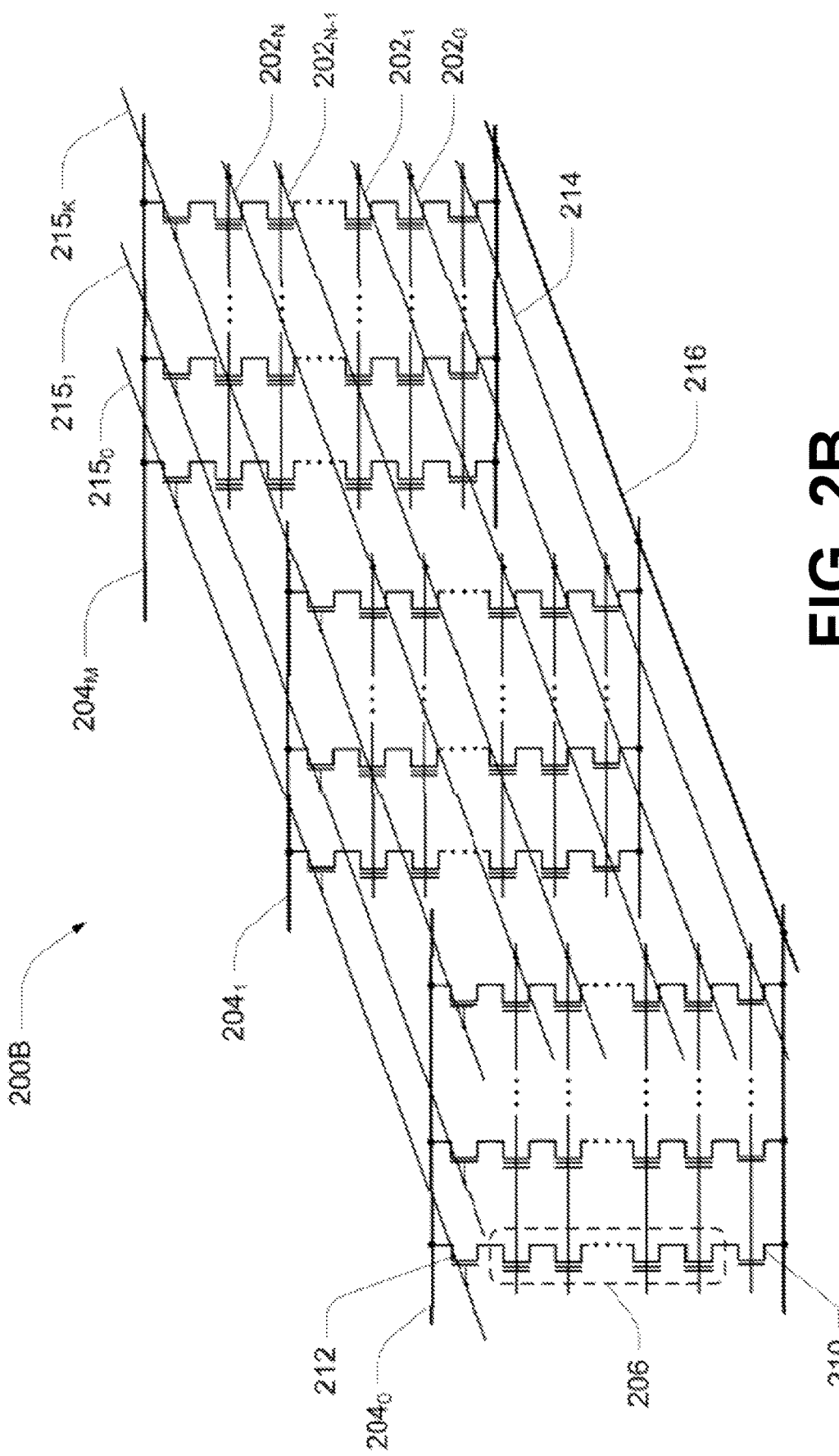

FIG. 2A-2B are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as wordlines $202_0$ to $202_N$, and data lines, such as bitlines $204_0$ to $204_M$. The wordlines 202 can be connected to global access lines (e.g., global wordlines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a wordline 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to wordline $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. Each wordline 202 can be connected to multiple rows of memory cells of the memory array 200B. Rows of memory cells that are commonly connected to each other by a particular wordline 202 can collectively be referred to as tiers.

Figure 3:
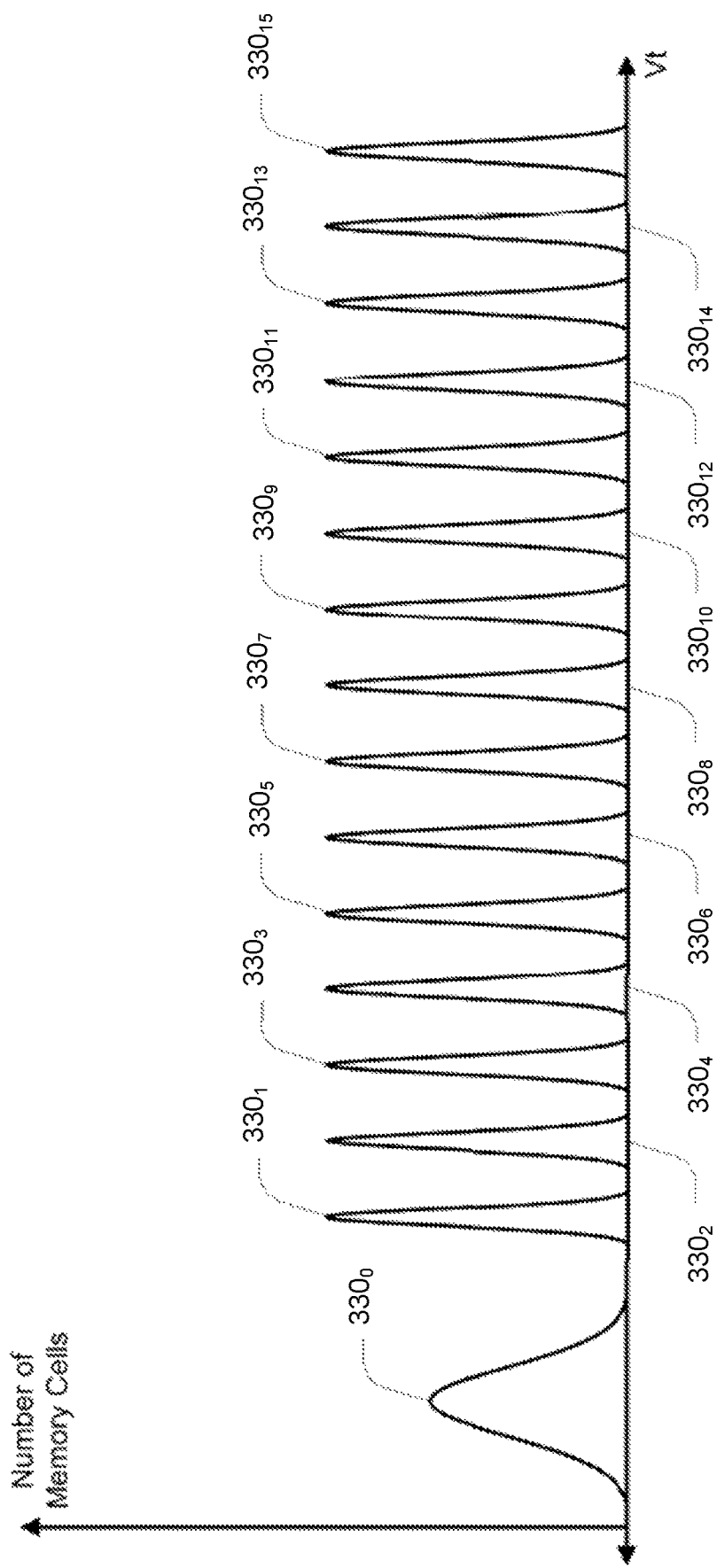
FIG. 3 is a conceptual depiction of threshold voltage distributions of multiple memory cells of a memory array according to an embodiment

FIG. 3 is a conceptual depiction of threshold voltage ranges of multiple memory cells. FIG. 3 illustrates an example of threshold voltage ranges and their distributions for a population of a sixteen-level memory cells, e.g., QLC memory cells. For example, such a memory cell can be programmed to a threshold voltage (Vt) that falls within one of sixteen different threshold voltage ranges $330_0$-$330_{15}$, each being used to represent a data state corresponding to a bit pattern of four bits. The threshold voltage range $330_0$ typically has a greater width than the remaining threshold voltage ranges $330_1$-$330_{15}$ as memory cells are generally all placed in the data state corresponding to the threshold voltage range $330_0$, then subsets of those memory cells are subsequently programmed to have threshold voltages in one of the threshold voltage ranges $330_1$-$330_{15}$. As programming operations are generally more incrementally controlled than erase operations, these threshold voltage ranges $330_1$-$330_{15}$ can tend to have tighter distributions.

The threshold voltage ranges $330_0$, $330_1$, $330_2$, $330_3$, $330_4$, $330_5$, $330_6$, $330_7$, $330_8$, $330_9$, $330_{10}$, $330_{11}$, $330_{12}$, $330_{13}$, $330_{14}$, and $330_{15}$ can each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $330_0$, the memory cell in this case can be storing a data state L0 having a data value of logical '1111' and is typically referred to as the erased state of the memory cell. If the threshold voltage is within the second of the sixteen threshold voltage ranges $330_1$, the memory cell in this case can be storing a data state L1 having a data value of logical '0111'. If the threshold voltage is within the third of the sixteen threshold voltage ranges $330_2$, the memory cell in this case can be storing a data state L2 having a data value of logical '0011,' and so on. Table 1 provides one possible correspondence between the data states and their corresponding logical data values. Other assignments of data states to logical data values are known or can be envisioned. Memory cells remaining in the lowest data state (e.g., the erased state or L0 data state), as used herein, will be deemed to be programmed to the lowest data state.

TABLE 1

| Data State | Logical Data Value |
| --- | --- |
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |

TABLE 1-continued

| Data State | Logical Data Value |
| --- | --- |
| L9 | 0100 |
| L10 | 0000 |
| L11 | 1000 |
| L12 | 1010 |
| L13 | 0010 |
| L14 | 0110 |
| L15 | 1110 |

Figure 4:
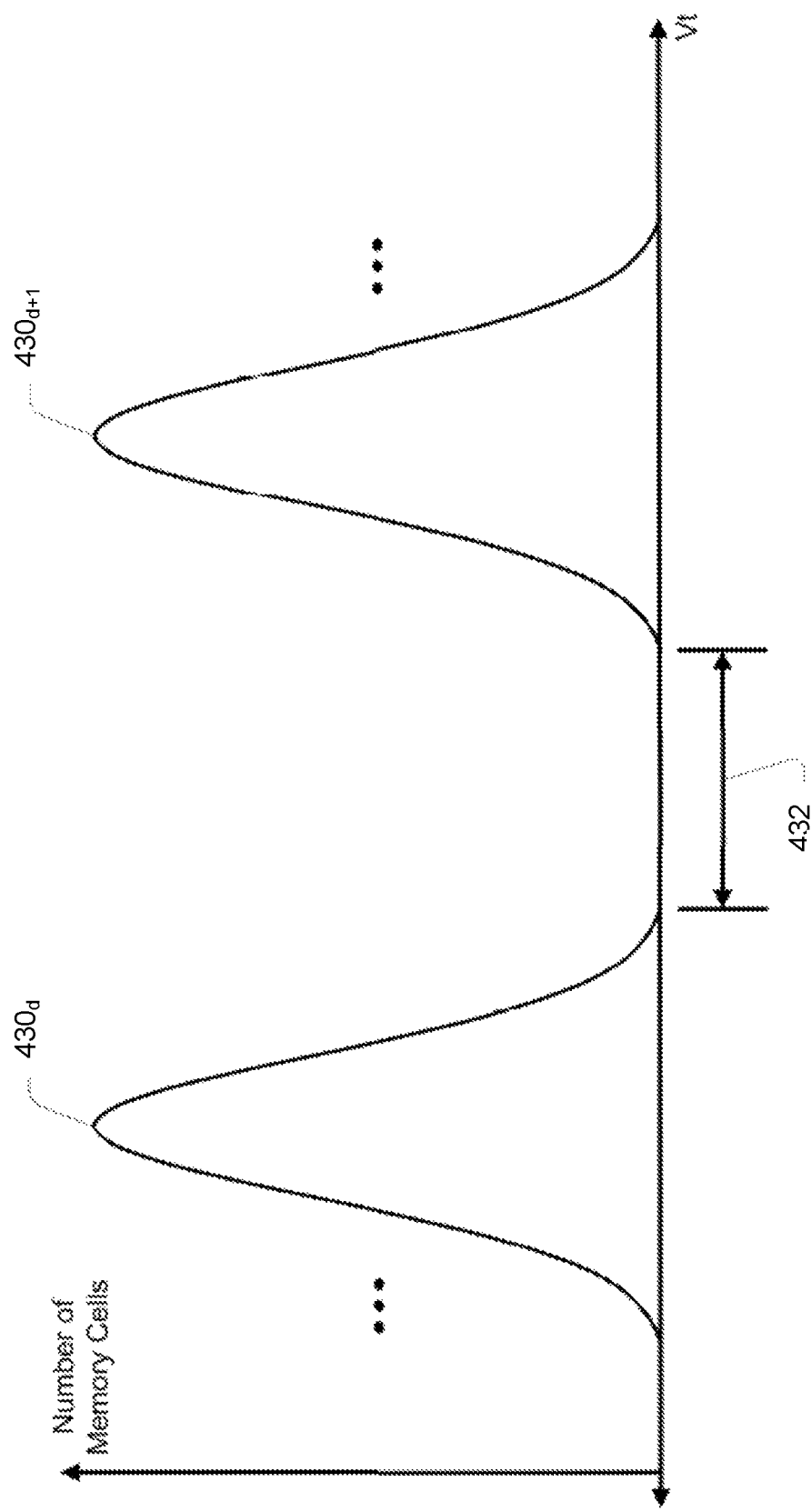
FIG. 4 is a conceptual depiction of a threshold voltage distribution of multiple memory cells at one stage following programming for use with various embodiments.

FIG. 4 is a conceptual depiction of a threshold voltage distribution of multiple memory cells following a programming operation. The threshold voltage distributions $430_d$-$430_{d+1}$ of FIG. 4 can represent some portion of the distributions for threshold voltage ranges $430_0$-$430_{15}$ of FIG. 3 at the completion of a programming operation for memory cells. With reference to FIG. 4, adjacent threshold voltage distributions 430 are typically separated by some margin 432 (e.g., dead space) at the completion of programming. Applying a sense voltage (e.g., read voltage) within the margin 432 to the control gates of the multiple memory cells can be used to distinguish between the memory cells of the threshold voltage distribution $430_d$ (and any lower threshold voltage distribution) and the memory cells of the threshold voltage distribution $430_{d+1}$ (and any higher threshold voltage distribution).

Figure 5A:
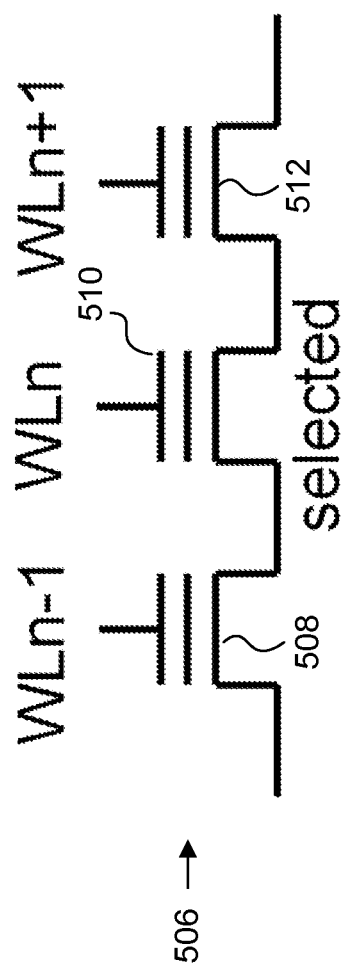
FIG. 5A is a schematic diagram of a selected memory cell and set of neighbor memory cells according to at least one embodiment.

FIG. 5A is a schematic diagram of a selected memory cell and set of neighbor memory cells according to at least one embodiment. For example, a string of memory cells 506 (which can be a part of an array of memory cells) can include a selected memory cell 510, a first neighbor memory cell 508, and a second neighbor memory cell 512. In at least one embodiment, the string of memory cells 506 is one of the NAND strings $206_0$ to $206_M$ discussed with reference to FIG. 2A or one of the NAND strings 206 of FIG. 2B. In one embodiment, each of the memory cells 508, 510, and 512 is associated with a different wordline. The selected memory cell 510 has a first wordline WLn, the first neighbor memory cell 508 has a wordline WLn-1, and the second neighbor memory cell 512 has a wordline WLn_1 for purposes of explanation.

Figure 5B:
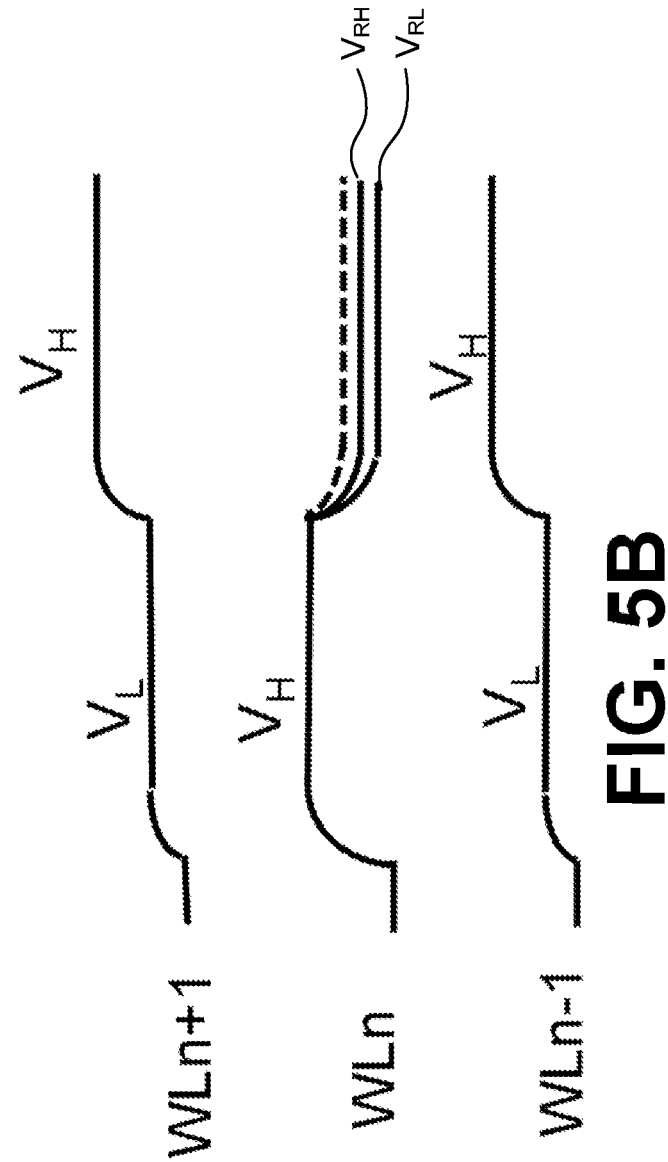
FIG. 5B is a graph illustrating example wordline waveforms associated with the memory cells of FIG. 5A for performing the fast two-sided corrective read operation according to at least one embodiment.

FIG. 5B is a graph illustrating example wordline waveforms associated with the memory cells of FIG. 5A for performing the fast two-sided corrective read operation according to at least one embodiment. In at least some embodiments, the control logic (e.g., the corrective reader 137) causes a first voltage ($V_H$) to be applied to the first wordline WLn of the selected memory cell 510 and causes a second voltage ($V_L$) to be applied to the wordlines adjacent to the first wordline (e.g., respectively WLn-1 and WLn+1) and associated with each of the two neighbor cells 508 and 510. In these embodiments, the second voltage is lower than the first voltage. For example, the first voltage can be in a 0.5-1.5V range while the second voltage is in the 4-6V range, which ranges are provided only by way of example.

With the voltage set in this way, the control logic can detect one of two states of the neighbor memory cells 508 and 510. If the two neighbor memory cells are erased, current will flow between a bitline and a source line of the string of memory cells 506. The bitline could be any of the bitlines $204_0$ to $204_M$ and the source line (SRC) could be the source line 216 of FIG. 2A, for example. If, however, at least one of the neighbor memory cells 508 or 510 is programmed, then current will not flow between the bitline and the source line. In some embodiments, a one-bit value can be stored in local memory of the memory device 130 (e.g., available to the local media controller 135) indicative of whether current flows through the two neighbor memory cells and the selected memory cell between the bitline and the source line.

In these embodiments, once the state of the neighbor memory cells 508 and 510 has been detected, the control logic adjusts the voltage of the wordlines WLn−1 and WLn+1 associated with each of the two neighbor cells to the high voltage ($V_H$) while adjusting the voltage of the first wordline WLn of the selected memory cell 510 according to that state. For example, in response to determining that current flows through the two neighbor memory cells 508 and 512 and the selected memory cell 510, the control logic identifies a lowest corrective read voltage ($V_{RL}$) of two corrective read voltages ($V_{RL}$ and $V_{RH}$). The control logic further causes the lowest corrective read voltage to be applied to the first wordline WLn during a read operation of the selected memory cell 510. In other words, the lowest read voltage is identified responsive to the two neighbor memory cells being in an erased state.

In at least some embodiments, the lowest read voltage ($V_{RL}$) is close to a highest corrective read voltage ($V_{HL}$), e.g., within 10-30% of the highest corrective read voltage, both of which are close to the low voltage ($V_L$), as illustrated. Further, in some embodiments, the lowest corrective read voltage ($V_{RL}$) is a first corrective read voltage and the highest corrective read voltage ($V_{HL}$) is a second corrective read voltage that is higher than the first corrective read voltage of multiple corrective read voltages (which may be more than two in number).

Further, according to various embodiments, in response to determining that current does not flow through the two neighbor memory cells and the selected memory cell, the control logic identifies the highest corrective read voltage ($V_{RH}$) of the multiple corrective read voltages. The control logic causes the highest corrective read voltage ($V_{RH}$) to be applied to the first wordline during a read operation of the selected memory cell 510. In other words, the highest corrective read voltage is identified responsive to one or both of the two neighbor memory cells being in a programmed state.

In at least some embodiments, once one of the two corrective read voltages ($V_{RL}$ or $V_{RH}$) has been applied to the first wordline WLn of the selected memory cell 510, the control logic causes a read operation to be performed at the selected memory cell 510, generally understood as the corrective read operation discussed herein in the sense of being performed while applying a corrective read voltage to the first wordline, WLn. The dashed line above the $V_{RH}$ line in FIG. 5B can be understood as a previous highest corrective read voltage when three voltage levels were applied (a different read voltage for each of the three memory cells), but can be eliminated in favor of having just two corrective read voltages.

Figure 6:
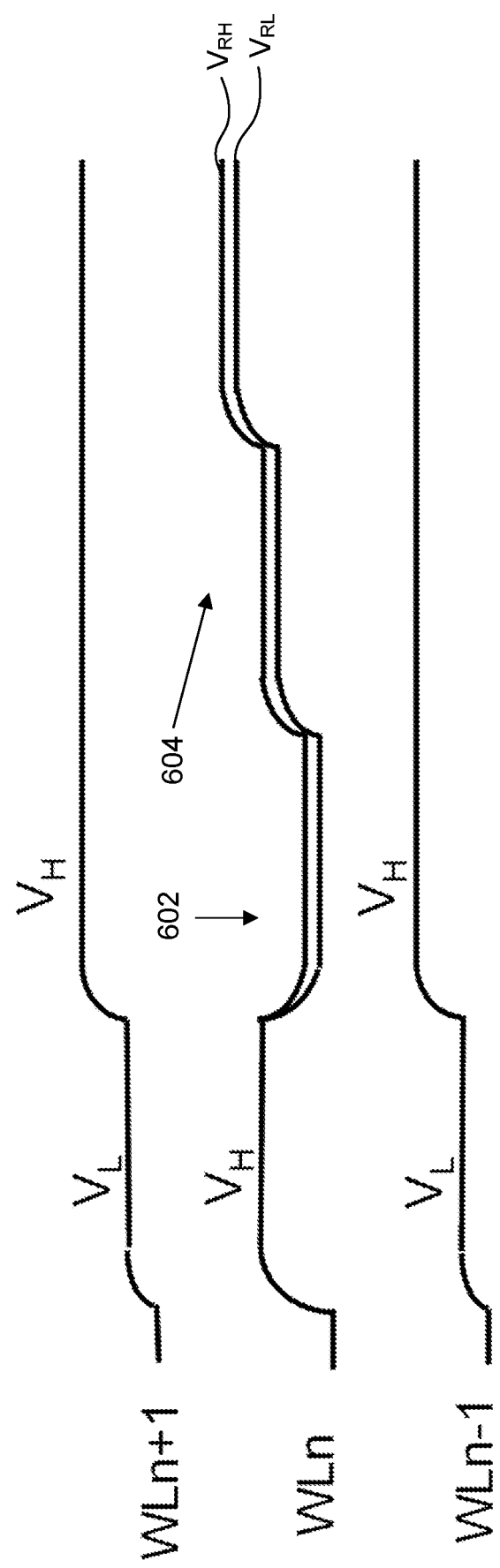
FIG. 6 is a graph illustrating extended waveforms from those of FIG. 5B for performing a further read operation using a one-bit value according to some embodiments.

FIG. 6 is a graph illustrating extended waveforms from those of FIG. 5B for performing a further read operation using a one-bit value according to some embodiments. For example, with reference to the selected memory cell 510, after a corrective read operation 602 is performed, the control logic can further use the one-bit value discussed above to cause one or more different types of read operations 604 (e.g., a multi-bit read, a valley track read, or a soft-bit read) to be performed at the selected memory cell 510. It can be observed that the two corrective read voltages ($V_{RL}$ and $V_{RH}$) are still available options to the control logic.

In at least some embodiments, a multi-bit read operation is performed to read more than one bit out of a multi-bit cell, such as a TLC, MLC, QLC, or PLC. In at least some embodiments, a valley track read operation is performed to determine where a deep valley between threshold voltage distributions is located by scanning Vt levels within the selected memory cell. In at least some embodiments, the soft-bit read operation is performed where a valley between threshold voltage distributions might be disappearing and thus to identify memory cells that are likely to be misread. Information obtained from a soft-bit read can be employed in standard ECC engines and algorithms, for example. The one-bit read value can also be used for other special types of read operations, as would be understood by one skilled in the art.

Figure 7:
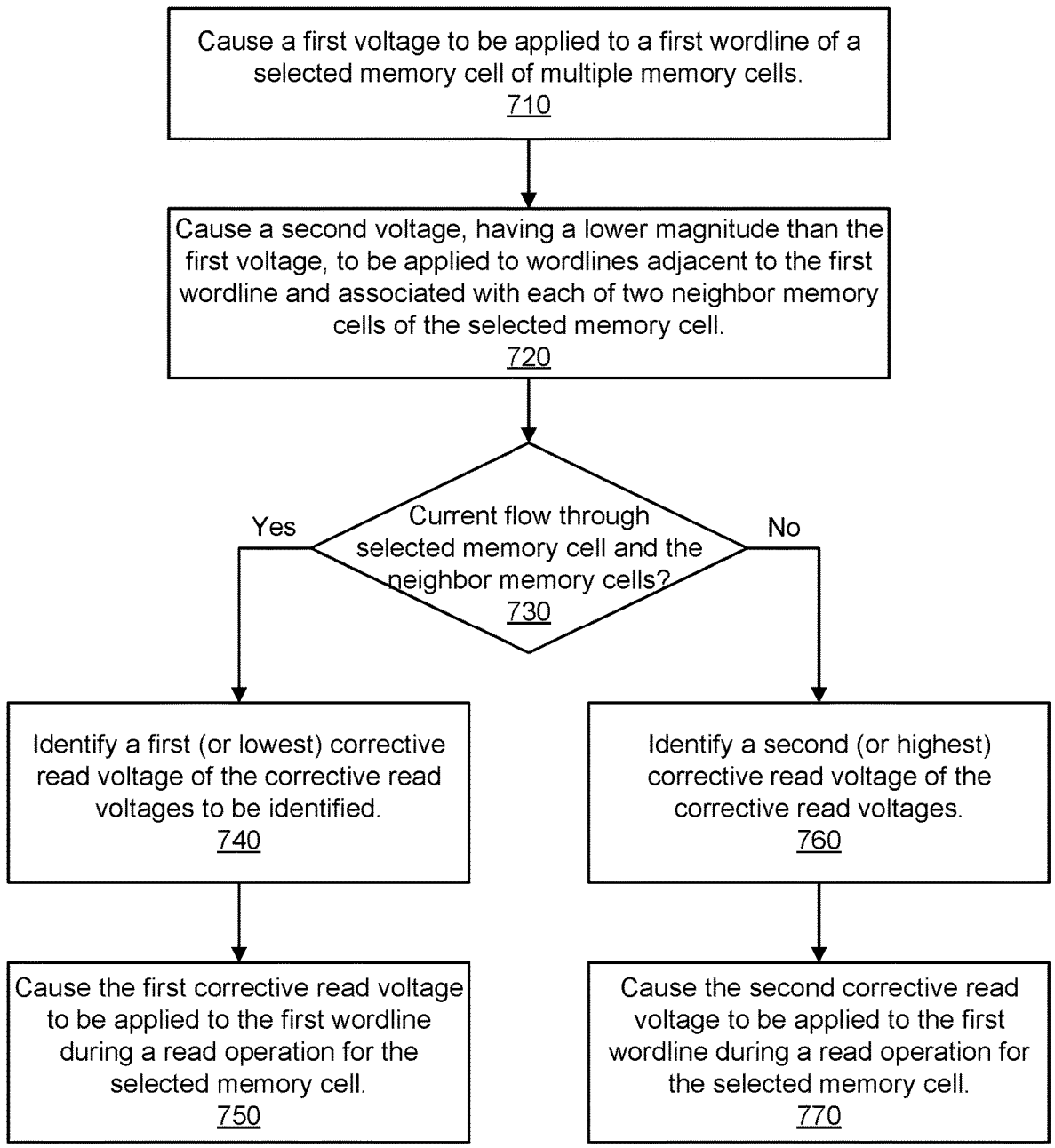
FIG. 7 is a flow diagram of an example method of performing a fast two-sided corrective read operation according to at least some embodiments.

FIG. 7 is a flow diagram of an example method 700 of performing a fast two-sided corrective read operation according to at least some embodiments. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the local media controller 135 (e.g., by the corrective reader 137 or other control logic) of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, a first voltage is applied. More specifically, the processing device causes a first voltage to be applied to a first wordline of a selected memory cell of multiple memory cells associated with multiple wordlines.

At operation 720, a second voltage is applied. More specifically, the processing device causes a second voltage, having a lower magnitude than the first voltage, to be applied to wordlines adjacent to the first wordline and associated with each of two neighbor memory cells of the selected memory cell.

At operation 730, current flow is sensed. More specifically, the processing device determines whether current flows through the selected memory cell and the two neighbor memory cells between a bitline and a source line of a memory array that includes the memory cells.

At operation 740, a first (or lowest) corrective read voltage is identified. More specifically, the processing device, in response to determining, at operation 730, that current flows through the two neighbor memory cells and the selected memory cell between the bitline and the source line, identifies a first corrective read voltage of multiple corrective read voltages to be applied to the wordline of the memory cell.

At operation 750, the first corrective read voltage is employed. More specifically, the processing logic causes the first corrective read voltage to be applied to the first wordline during a read operation for the selected memory cell.

At operation 760, a second (or highest) corrective read voltage is identified. More specifically, the processing device, in response to determining, at operation 730, that current does not flow through the two neighbor memory cells and the memory cell, identifies a second corrective read voltage of the multiple corrective read voltages to be applied to the first wordline during the read operation of for the selected memory cell. As discussed, in some embodiments, the second corrective read voltage is a higher read voltage than the first corrective read voltage, and in some cases, the multiple corrective read voltages are two in number.

At operation 770, the second corrective read voltage is employed. More specifically, the processing logic causes the second corrective read voltage to be applied to the first wordline during a read operation for the selected memory cell.

Figure 8:
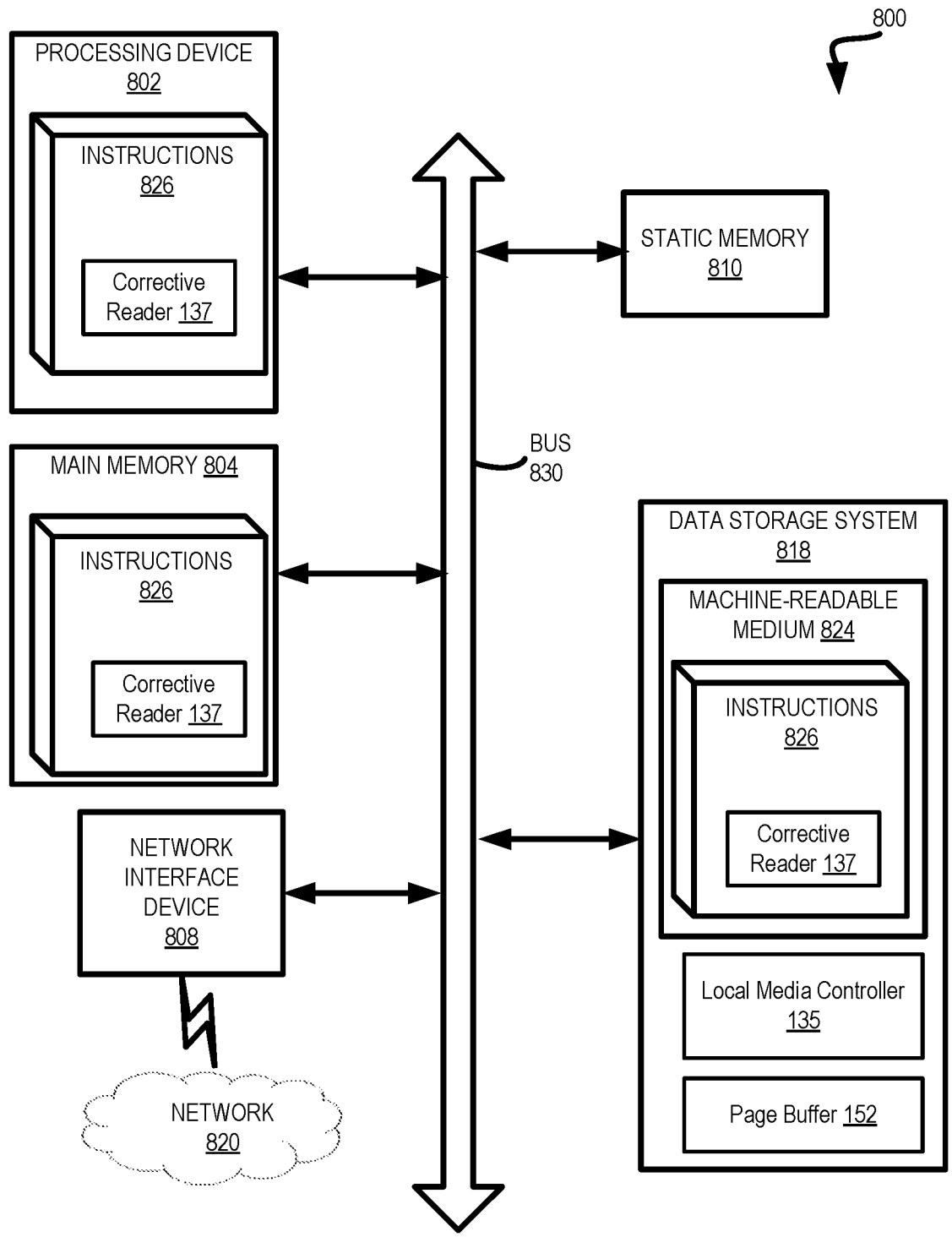
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 810 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 828 for performing the operations and steps discussed herein. The computer system 800 can further include a network interface device 812 to communicate over the network 820.

The data storage system 818 can include a machine-readable storage medium 824 (also known as a computer-readable medium) on which is stored one or more sets of instructions 828 or software embodying any one or more of the methodologies or functions described herein. The data storage system 818 can further include the local media controller 135 and the page buffer 152 that were previously discussed. The instructions 828 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1A.

In one embodiment, the instructions 826 include instructions to implement functionality corresponding to a controller (e.g., the memory sub-system controller 115 of FIG. 1A) and can include instructions for the corrective reader 137. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   an array comprising a plurality of memory cells associated with a plurality of wordlines; and
   control logic operatively coupled to the array, the control logic to perform operations that cause a corrective read operation to be performed at a selected memory cell of the plurality of memory cells, wherein the operations comprise:
   causing a first voltage to be applied to a first wordline associated with the selected memory cell;
   causing a second voltage, having a lower magnitude than the first voltage, to be applied to wordlines adjacent to the first wordline and associated with each of two neighbor memory cells of the selected memory cell;
   in response to determining that current flows through the two neighbor memory cells and the selected memory cell between a bitline and a source line of the array while the first voltage is applied to the first wordline and the second voltage is applied to the wordlines adjacent to the first wordline, identifying a first corrective read voltage of a plurality of corrective read voltages; and
   causing the first corrective read voltage to be applied to the first wordline during a read operation for the selected memory cell.

2. The memory device of claim 1, wherein the first corrective read voltage is a lowest one of the plurality of corrective read voltages.

3. The memory device of claim 1, wherein the first corrective read voltage is identified responsive to the two neighbor memory cells being in an erased state.

4. The memory device of claim 1, wherein operations further comprise:
   in response to determining that current does not flow through the two neighbor memory cells and the selected memory cell, identifying a second corrective read voltage of the plurality of corrective read voltages; and
   causing the second corrective read voltage to be applied to the first wordline during the read operation for the selected memory cell.

5. The memory device of claim 4, wherein the second corrective read voltage is higher than the first corrective read voltage, and wherein the second corrective read voltage is identified responsive to one or both of the two neighbor memory cells being in a programmed state.

6. The memory device of claim 1, wherein the operations further comprise storing, in local memory, a one-bit value indicative of whether current flows through the two neighbor memory cells and the selected memory cell between the bitline and the source line.

7. The memory device of claim 6, wherein the operations further comprise using the one-bit value to cause one of a multi-bit read, a valley track read, or a soft-bit read to be performed at the selected memory cell.

8. A memory device comprising:
   an array comprising a plurality of memory cells associated with a plurality of wordlines; and
   control logic operatively coupled to the array, the control logic to perform operations that cause a corrective read operation to be performed at a selected memory cell of the plurality of memory cells, wherein the operations comprise:
   causing a first voltage to be applied to a first wordline associated with the selected memory cell;
   causing a second voltage, having a lower magnitude than the first voltage, to be applied to wordlines adjacent to the first wordline and associated with each of two neighbor memory cells of the selected memory cell;
   in response to determining that current does not flow through the two neighbor memory cells and the selected memory cell between a bitline and a source line of the array while the first voltage is applied to the first wordline and the second voltage is applied to the wordlines adjacent to the first wordline, identifying a second corrective read voltage of a plurality of corrective read voltages; and
   causing the second corrective read voltage to be applied to the first wordline during a read operation for the selected memory cell.

9. The memory device of claim 8, wherein the second corrective read voltage is a highest one of the plurality of corrective read voltages.

10. The memory device of claim 9, wherein the second corrective read voltage is identified responsive to one or both of the two neighbor memory cells being in a programmed state.

11. The memory device of claim 8, wherein the operations further comprise:
    in response to determining that current flows through the two neighbor memory cells and the selected memory cell, identifying a first corrective read voltage of the plurality of corrective read voltages; and causing the first corrective read voltage to be applied to the first wordline during the read operation of the selected memory cell.

12. The memory device of claim 11, wherein the second corrective read voltage is higher than the first corrective read voltage, and the first corrective read voltage is identified responsive to one or both of the two neighbor memory cells being in an erased state.

13. The memory device of claim 8, wherein the operations further comprise storing, in local memory, a one-bit value indicative of whether the current flows through the two neighbor memory cells and the selected memory cell between the bitline and the source line.

14. The memory device of claim 13, wherein the operations further comprise using the one-bit value to cause one of a multi-bit read, a valley track read, or a soft-bit read to be performed at selected the memory cell.

15. A method comprising:
   causing, by control logic of a memory device, a first voltage to be applied to a first wordline associated with a selected memory cell of a plurality of memory cells;
   causing, by the control logic, a second voltage, having a lower magnitude than the first voltage, to be applied to wordlines adjacent to the first wordline and associated with each of two neighbor memory cells of the selected memory cell;
   in response to determining that current flows through the two neighbor memory cells and the selected memory cell between a bitline and a source line of the plurality of memory cells while the first voltage is applied to the first wordline and the second voltage is applied to the wordlines adjacent to the first wordline, identifying, by the control logic, a first corrective read voltage of a plurality of corrective read voltages; and causing, by the control logic, the first corrective read voltage to be applied to the first wordline during a read operation for the selected memory cell.

16. The method of claim 15, wherein the first corrective read voltage is a lowest one of the plurality of corrective read voltages, and the first corrective read voltage is identified responsive to the two neighbor memory cells being in an erased state.

17. The method of claim 15, further comprising:
   in response to determining that current does not flow through the two neighbor memory cells and the selected memory cell, identifying a second corrective read voltage of the plurality of corrective read voltages; and
   causing the second corrective read voltage to be applied to the first wordline during the read operation for the selected memory cell.

18. The method of claim 17, wherein the second corrective read voltage is higher than the first corrective read voltage, and wherein the second corrective read voltage is identified responsive to one or both of the two neighbor memory cells being in a programmed state.

19. The method of claim 15, further comprise storing, in local memory, a one-bit value indicative of whether the current flows through the two neighbor memory cells and the selected memory cell between the bitline and the source line.

20. The method of claim 19, further comprising using the one-bit value to cause one of a multi-bit read, a valley track read, or a soft-bit read to be performed at the selected memory cell.

* * * * *